(12) United States Patent
Wei et al.

(10) Patent No.: US 11,035,813 B2
(45) Date of Patent: Jun. 15, 2021

(54) DETECTION DEVICE AND IDENTIFICATION SYSTEM

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Fu-Cheng Wei, Zhunan (TW); Chih-Lin Liao, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 206 days.

(21) Appl. No.: 16/258,949

(22) Filed: Jan. 28, 2019

(65) Prior Publication Data
US 2020/0103360 A1 Apr. 2, 2020

(30) Foreign Application Priority Data
Sep. 29, 2018 (CN) .......................... 201811149699.2

(51) Int. Cl.
| | | |
|---|---|---|
| G01N 21/41 | (2006.01) | |
| G02B 1/04 | (2006.01) | |
| G02B 13/00 | (2006.01) | |
| G02B 27/42 | (2006.01) | |
| G01N 27/04 | (2006.01) | |
| G01N 27/20 | (2006.01) | |
| G01R 19/165 | (2006.01) | |
| G06K 9/00 | (2006.01) | |

(52) U.S. Cl.
CPC .......... *G01N 27/045* (2013.01); *G01N 21/41* (2013.01); *G01N 27/20* (2013.01); *G01R 19/16576* (2013.01); *G06K 9/00228* (2013.01)

(58) Field of Classification Search
CPC ......... G02B 1/041; G02B 1/111; G02B 1/116; G02B 1/00; G02B 1/115; G02B 1/118; G02B 27/425; C12Q 2565/607; G01N 21/41; G01N 2021/8438; G01N 2030/6013
See application file for complete search history.

(56) References Cited

FOREIGN PATENT DOCUMENTS

| JP | 2002181717 | * | 6/2006 | ............. G01N 21/89 |
|---|---|---|---|---|
| JP | 2006258746 | * | 9/2006 | ............. G01N 27/20 |

* cited by examiner

*Primary Examiner* — Alesa Allgood
(74) *Attorney, Agent, or Firm* — ScienBiziP, P.C.

(57) ABSTRACT

A detection device includes a light refraction structure and a resistance detection circuit. The light refraction structure includes a substrate, a conductive layer, and a refraction layer. The conductive layer and the refraction layer are formed on the substrate. The conductive layer includes a resistance. The resistance detection circuit is electrically coupled to the conductive layer and is adapted to detect the resistance of the conductive layer. The resistance detection circuit generates a detection signal according to a change in the resistance, and the detection signal represents a state of the refraction layer.

16 Claims, 10 Drawing Sheets

DETECTION DEVICE AND IDENTIFICATION SYSTEM

FIELD

The subject matter herein generally relates to detection devices, and more particularly to a detection device of an identification system.

BACKGROUND

With emphasis on information security, many systems (such as access control systems) or terminals (such as mobile phones) are equipped with face recognition functions.

A module for realizing the face recognition function generally uses a laser as a light source, and an optical element is disposed at an exit end to scatter the laser light, and then the light emitted by scattering is captured to capture the face image information. However, the optical element to scatter the laser at the laser exit end may be damaged. For example, if the optical element is broken, the laser light reaching the optical element may not be sufficiently scattered, and light reaching the face through the crack, especially lasers that reach a human eye, can cause damage to the human eye. In addition, when the optical components are damaged and no longer function properly, the laser source may continue to operate, which causes a waste of energy.

BRIEF DESCRIPTION OF THE DRAWINGS

Implementations of the present disclosure will now be described, by way of embodiments, with reference to the attached figures.

DETAILED DESCRIPTION

Figure 1:
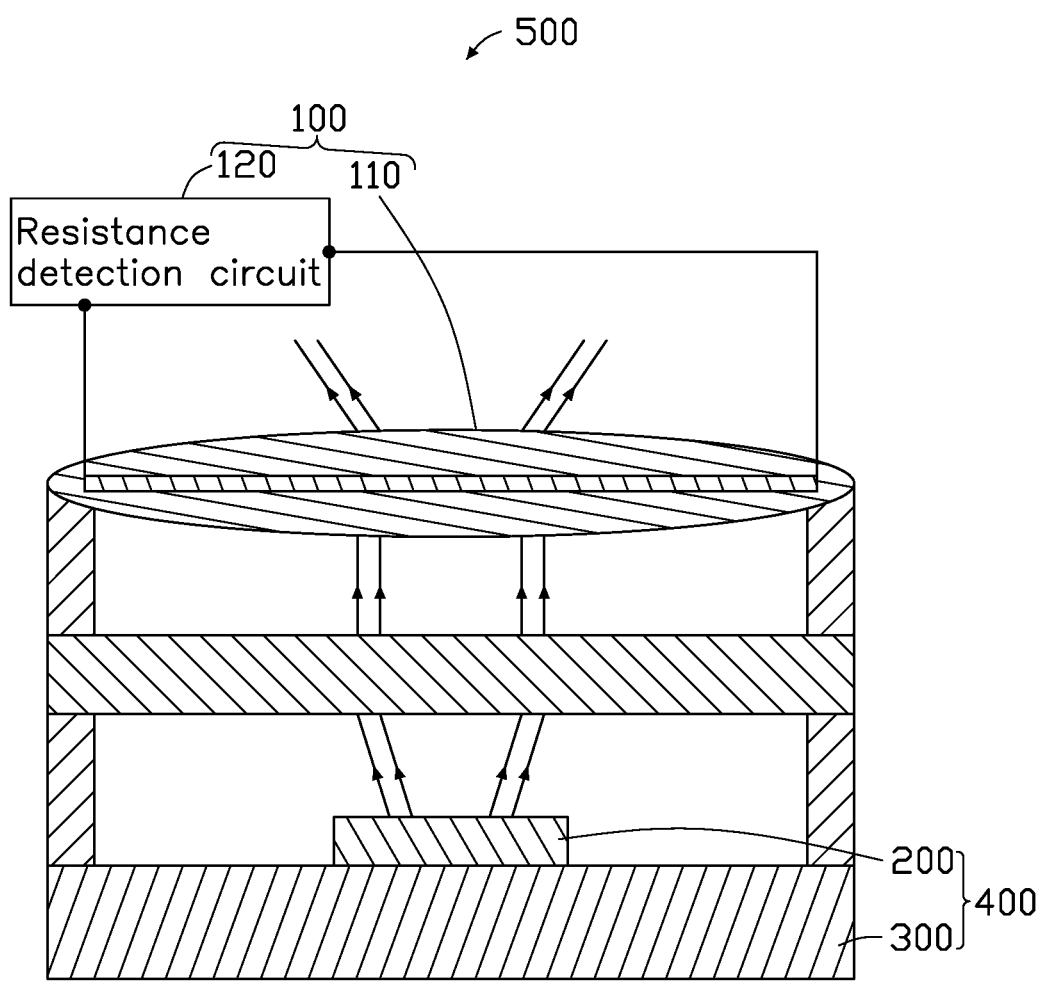
FIG. 1 is a diagram of an identification system in accordance with an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 shows an embodiment of an identification system 500 including a detection device 100 and a light source module 400. The detection device 100 is adapted to detect a state of the light source module 400. As shown in FIG. 1, the detection device 100 includes a light refraction structure 110 and a resistance detection circuit 120. The light source module 400 includes a light source 200 and a base plate 300. In one embodiment, the light source 200 is mounted on the base plate 300, and the light refraction structure 110 is mounted in a light path of the light source 200.

Figure 2:
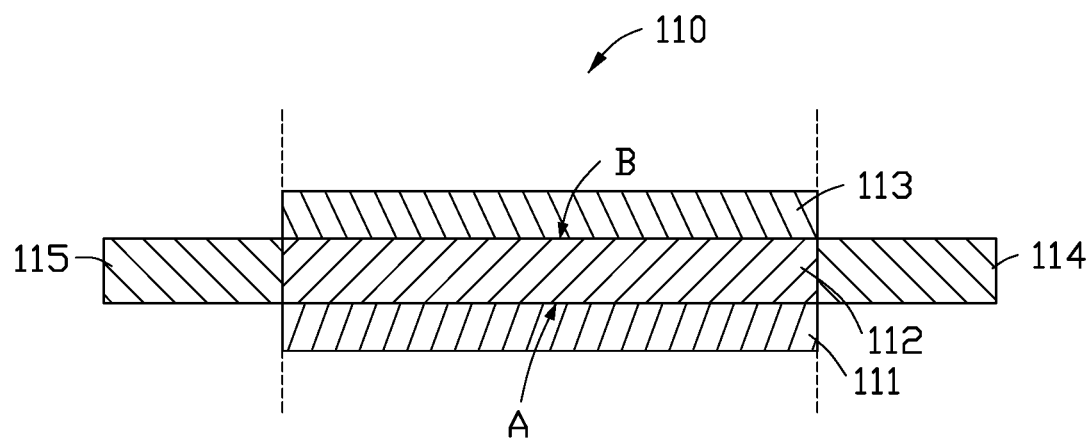
FIG. 2 is a diagram of a light refraction structure in FIG. 1.

As shown in FIG. 2, the light refraction structure 110 includes a substrate 111, a conductive layer 112, and a refraction layer 113. The substrate 111 is made of insulating material, such as silicon dioxide. The conductive layer 112 includes a light input surface A and a light output surface B. The conductive layer 112 is made of transparent conductive material. Light emitted by the light source 200 enters the conductive layer 112 from the light input surface A and exits the conductive layer 112 from the light output surface B. The conductive layer 112 is made of transparent material to minimize loss of light passing through. In one embodiment, the refraction layer 113 is a film made of organic glass and adapted to refract and expand the light passing through.

Figure 3A:
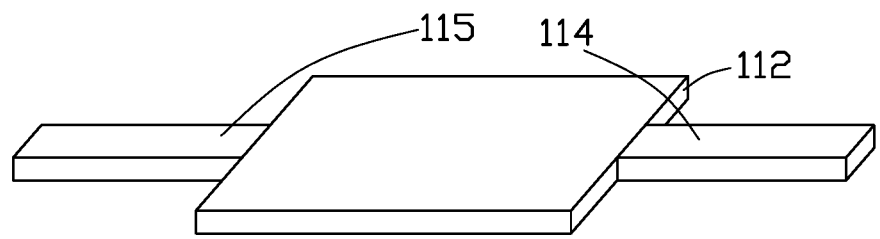
FIGS. 3A-3C are diagrams of a conductive layer of the light refraction structure.
Figure 3B:
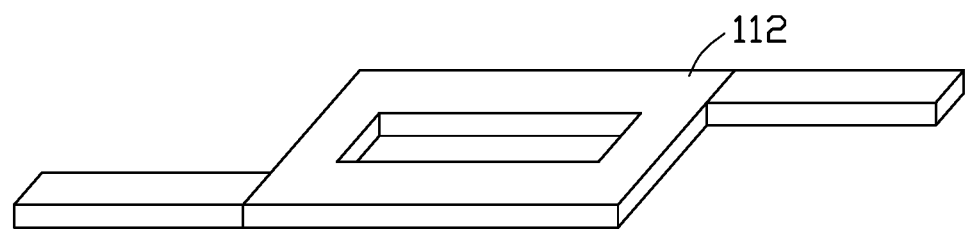
Figure 3C:
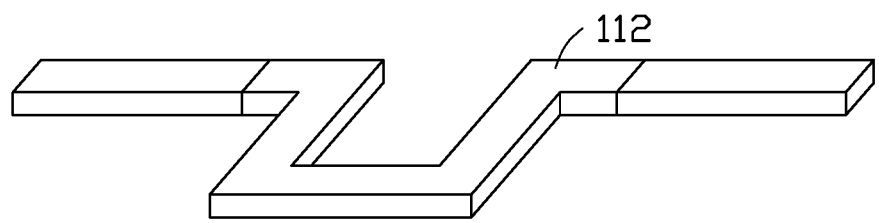
Figure 4A:
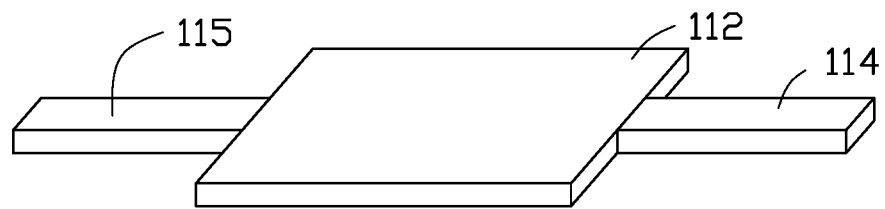
FIGS. 4A-4D are diagrams of the conductive layer coupled to a first connection pad and a second connection pad.
Figure 4B:
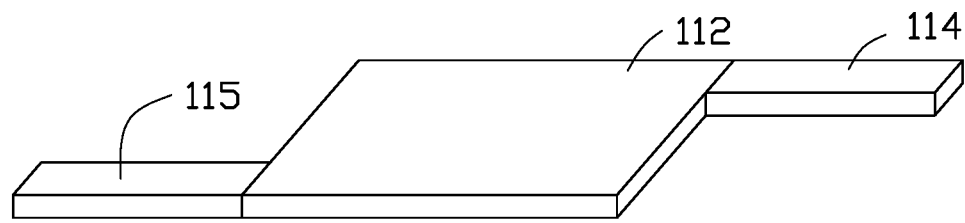
Figure 4C:
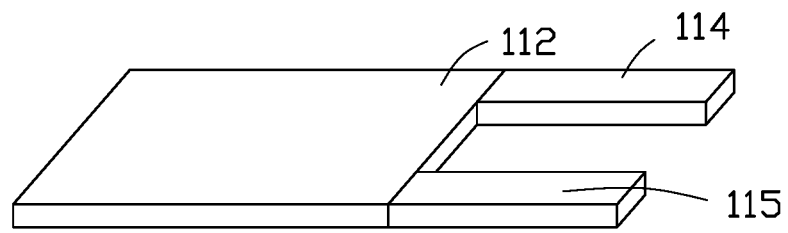
Figure 4D:
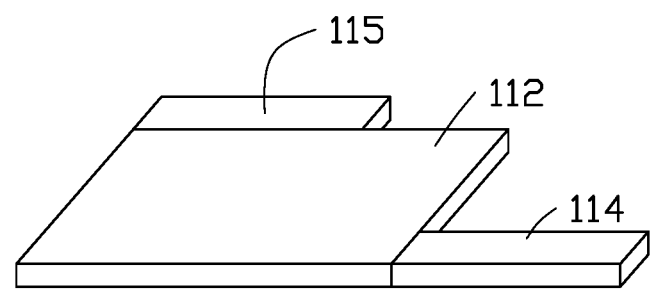

FIGS. 3A-3C show different embodiments of the conductive layer 112. In FIG. 3A, the conductive layer 112 is a rectangular plate. In FIG. 3B, the conductive plate 112 is a hollow rectangular plate. In FIG. 3C, the conductive plate 112 is an irregularly shaped plate. In other embodiments, the conductive layer 112 can be other shapes.

FIGS. 4A-4D show different embodiments of the conductive layer 112 coupled to a first connection pad 114 and a second connection pad 115. The first connection pad 114 and the second connection pad 115 can be coupled to a same side of the conductive layer 112 or to different sides of the conductive layer 112. The first connection pad 114 and the second connection pad 115 can be coupled at any position of the conductive layer 112.

Figure 5:
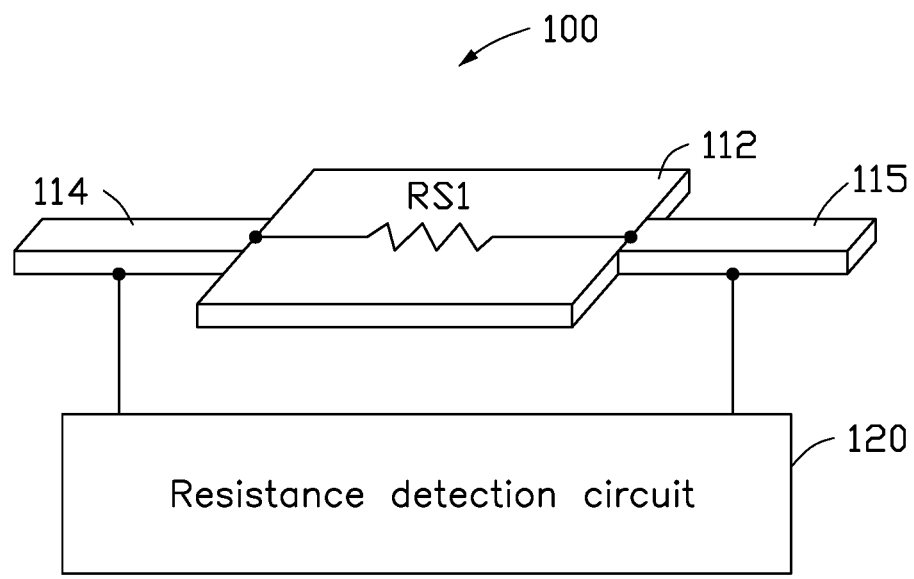
FIG. 5 is a diagram of an equivalent circuit of a detection device of the identification system in FIG. 1.

FIG. 5 shows an equivalent circuit of the detection device 100. In one embodiment, the conductive layer 112 is coupled between the first connection pad 114 and the second connection pad 115. The conductive layer 112, the first connection pad 114, the second connection pad 115, and the resistance detection circuit 120 form a closed circuit, and the conductive layer 112 is equivalent to a first sense resistance Rs1. A resistance value of the conductive circuit 112 is determined by a material and size of the conductive layer 112.

When the light refraction structure 110 is damaged, the refraction layer 113 and the conductive layer 112 both become damaged, which results in a change in resistance of the conductive layer 112. The resistance detection circuit 120 determines the state of the conductive circuit 112 according to a detection signal of detecting the conductive layer 112, thereby determining a state of the refraction layer 113.

The detection signal can switch between a first voltage level and a second voltage level. In one embodiment, the first voltage level is a low voltage level, such as 0, and the second voltage level is a high voltage level, such as 1. When the detection signal is at the first voltage level, the refraction layer 113 is in a normal state (not damaged). When the detection signal is at the second voltage level, the refraction layer 113 is in an abnormal state (damaged).

Figure 6:
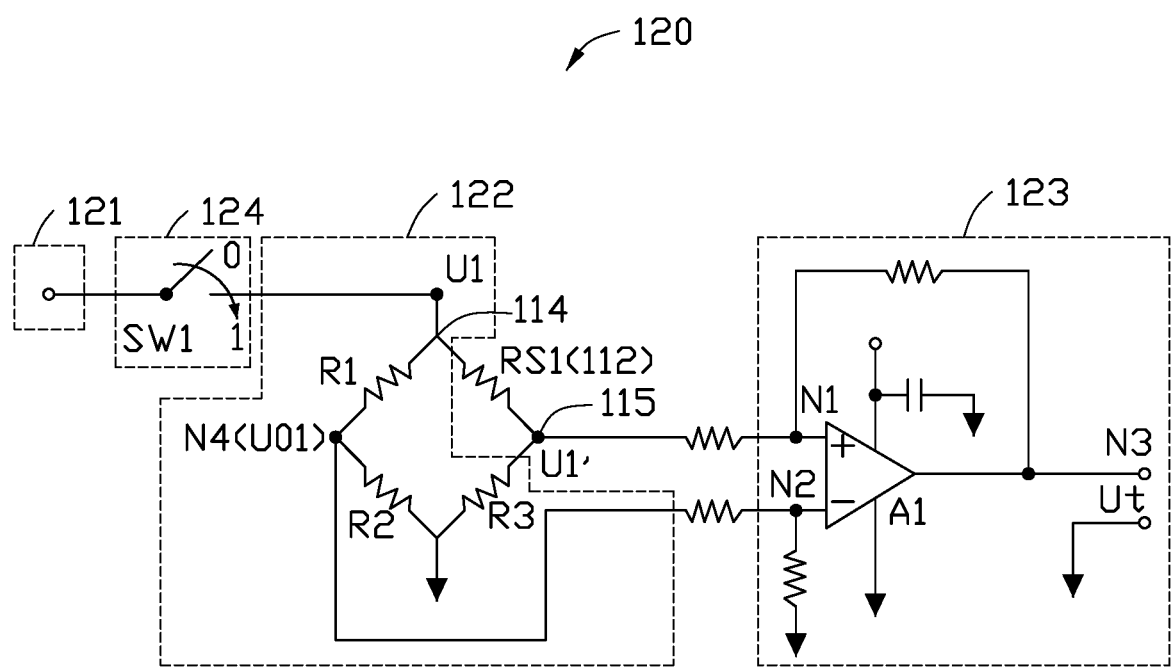
FIG. 6 is an equivalent circuit diagram of a resistance detection circuit.

As shown in FIG. 6, the resistance detection circuit 120 includes a first voltage source 121, a first detection module 122, and a first comparison module 123.

The first voltage source 121 is adapted to provide a first voltage U1 and is coupled to the first detection module 122. The first detection module 122 is coupled to the conductive layer 112 through the first connection pad 114 and the second connection pad 115 and is adapted to receive the first voltage U1 and output a first sensing voltage U1' to the first comparison module 123 according to the first voltage U1. The first comparison module 123 is coupled to the first detection module 122 and is adapted to compare the first sensing voltage U1' to a first present voltage U01 and output a detection signal Ut according to the comparison result. A voltage level of the detection signal Ut can reflect whether a current resistance value of the conductive layer 112 changes relative to an initial resistance value of the conductive layer 112.

In one embodiment, the first detection module 122 and the first sense resistance Rs1 form an electric bridge including a first resistor R1, a second resistor R2, and a third resistor R3. The first comparison module 123 includes an amplifier A1 including a first input terminal N1, a second input terminal N2, and a first detection signal output terminal N3. The first input terminal N1 is a positive input terminal of the amplifier A1, and the second input terminal N2 is a negative input terminal of the amplifier A1.

The first connection pad 114 is a signal input terminal coupled to the first voltage source 121, the first resistor R1, and the first sense resistance Rs1. The second connection pad 115 is a signal output terminal coupled to the first sense resistance Rs1 and the first input terminal N1 of the amplifier A1. A node N4 between the first resistor R1 and the second resistor R2 is coupled to the second input terminal N2 of the amplifier A1. The first node N4 outputs the first preset voltage U01 to the second input terminal N2.

The resistance detection circuit 120 further includes a first switch module 124 including a first switch SW1. The first switch SW1 includes a state 1 and a state 0. The state 1 represents that the first switch SW1 is turned on, and the state 0 represents that the first switch SW1 is turned off. The first switch SW1 switches between the state 1 and the state 0 according to the first voltage. When the first voltage U1 is at a high voltage level, the first switch SW1 is in the state 1. When the first voltage U1 is at a low voltage level, the first switch SW1 is in the state 0. The first switch module 124 can control the first switch SW1 to be turned on when the resistance of the first sense resistance Rs1 needs to be detected. The first switch module 124 can control the first switch SW1 to be turned off when the resistance of the first sense resistance Rs1 is not required to be detected.

Figure 7:
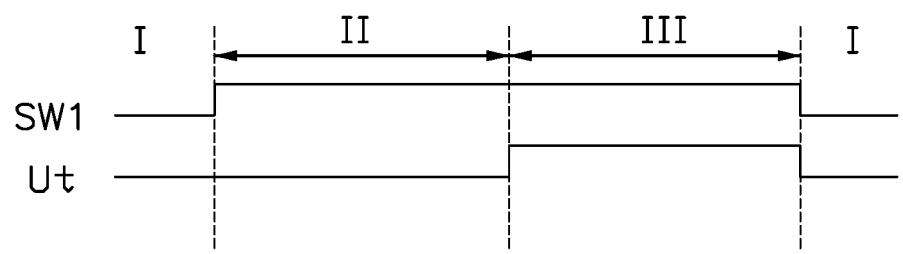
FIG. 7 is a comparison of a state of a first switch SW1 and an output state of a detection signal Ut of a first detection signal output terminal N3.

As shown in FIG. 7, a comparison of a state of the first switch SW1 and an output state of the detection signal Ut of the first detection signal output terminal N3 is shown, which mainly includes three phases of phase I, phase II, and phase III.

In one embodiment, the first voltage U1 is a power supply voltage output by the first voltage source 121, which can be switched between a low level and a high level. In phase I, the first voltage source 121 outputs the first voltage U1. When the first switch SW1 is in the off state, the detection signal Ut outputted by the first detection signal output terminal N3 is 0, and the resistance detecting circuit 120 is not in the working state.

In phase II, the first voltage source 121 outputs the first voltage U1 at the high level, and the first switch SW1 is in the on state. In the electric bridge, a resistance value of the first sense resistance Rs1 is an initial resistance value. A resistance value of the first resistor R1, the second resistor R2, the third resistor R3, and the first sense resistance Rs1 satisfy equation (1):

$$R1 \times R3 = R2 \times Rs1 \qquad (1)$$

According to equation (1) and the electric bridge, when the value of the first voltage U1 is constant, since the resistance values of the first resistor R1 and the second resistor R2 are unchanged, the first preset voltage U01 of the first node N4 is unchanged, and the voltage at the second input terminal N2 does not change. According to equation (1), the value of the first sensing voltage U1' input to the first input terminal N1 is equal to the value of the first preset voltage U01, and the first detection signal output terminal N3 outputs the detection signal Ut at the first level. That is, the detection signal Ut whose output level is 0 represents that the light refraction structure 110 as in the normal state.

In phase III, the refraction layer 113 is damaged, causing the conductive layer 112 to be also damaged. The resistance of the first sense resistance Rs1 is increased, so that the equation (1) is no longer satisfied. When the resistance of the first sense resistance Rs1 is increased, the voltage value input to the first input terminal N1 is greater than the first preset voltage U01, and the first detection signal output terminal N3 outputs the detection signal Ut at the second level of 1. Thus, the refraction layer 113 is in the abnormal state.

In the above embodiment, the voltage level of the detection signal Ut represents whether the resistance of the conductive layer 112 (i.e., the first sense resistance Rs1) changes, and further determines whether the refraction layer 113 is damaged.

Figure 8:
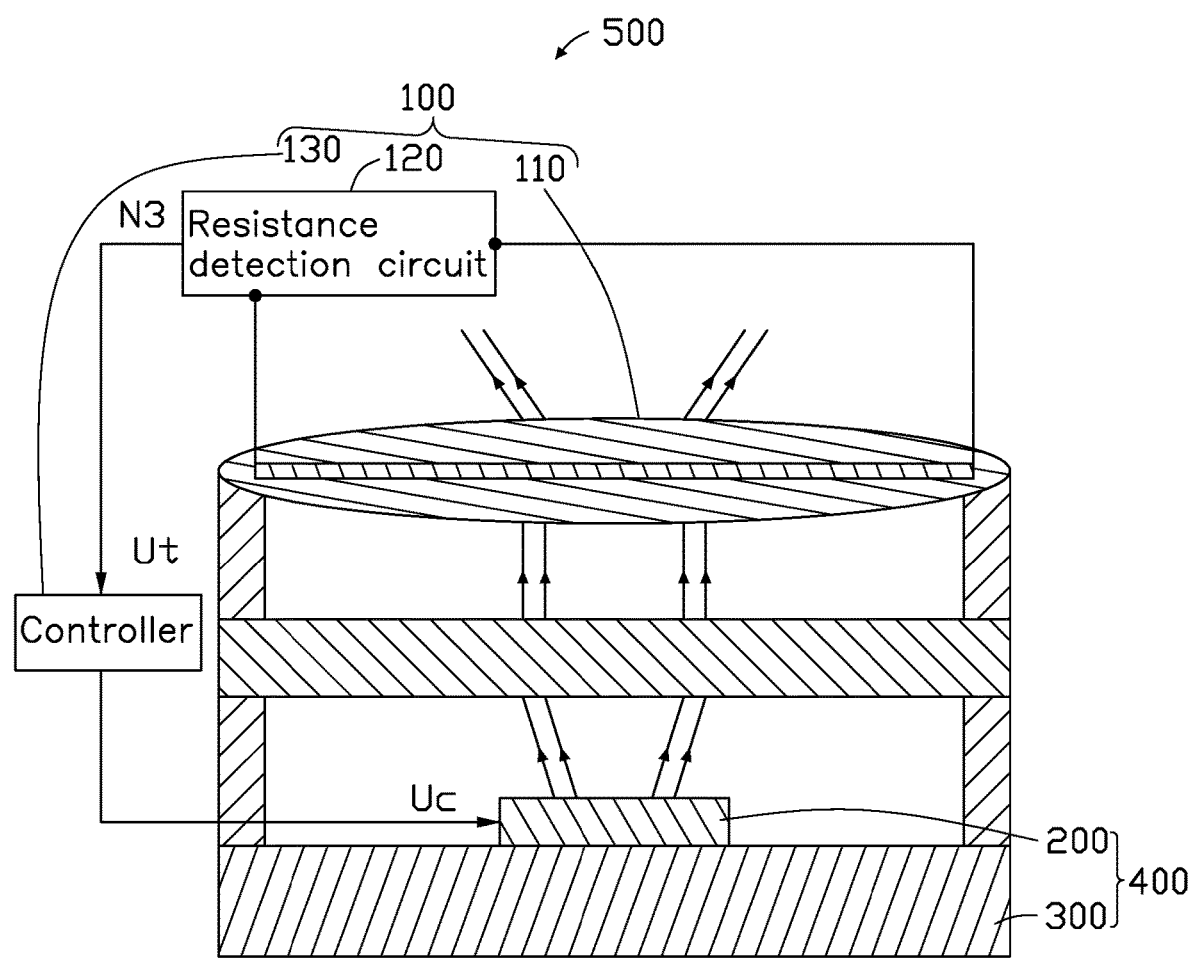
FIG. 8 is a diagram of another embodiment of the identification system.

As shown in FIG. 8, in an embodiment, the detection device 100 further includes a controller 130. The controller 130 is connected to the light source 200, and is further connected to the first detection signal output terminal N3. The controller 130 receives the detection signal Ut output by the signal output terminal N3 and analyzes the detection signal Ut to determine whether the resistance value of the first sense resistance Rs1 is the initial resistance value, and further determines whether to output a control signal Uc to the light source 200 to cause the light source 200 to emit light.

In one embodiment, when the detection signal Ut is output as 0, the controller 130 determines that the refraction layer 113 is in the normal state, and the output control signal Uc controls the light source 200 to emit light. When the detection signal Ut is output as 1, the controller 130 determines the refraction layer 113 is in the abnormal state, and the control signal Uc is not output.

The present embodiment further provides an identification system 500, including a light source module 400 and a detecting device 100 (see FIGS. 1 and 8). The light source module 400 includes a light source 200. In this embodiment, the light source 200 is a laser source, and the light refraction structure 110 of the detection device 100 is disposed in a light path of the light emitted from the light source 200 to refract the laser light emitted from the light source 200.

Figure 9:
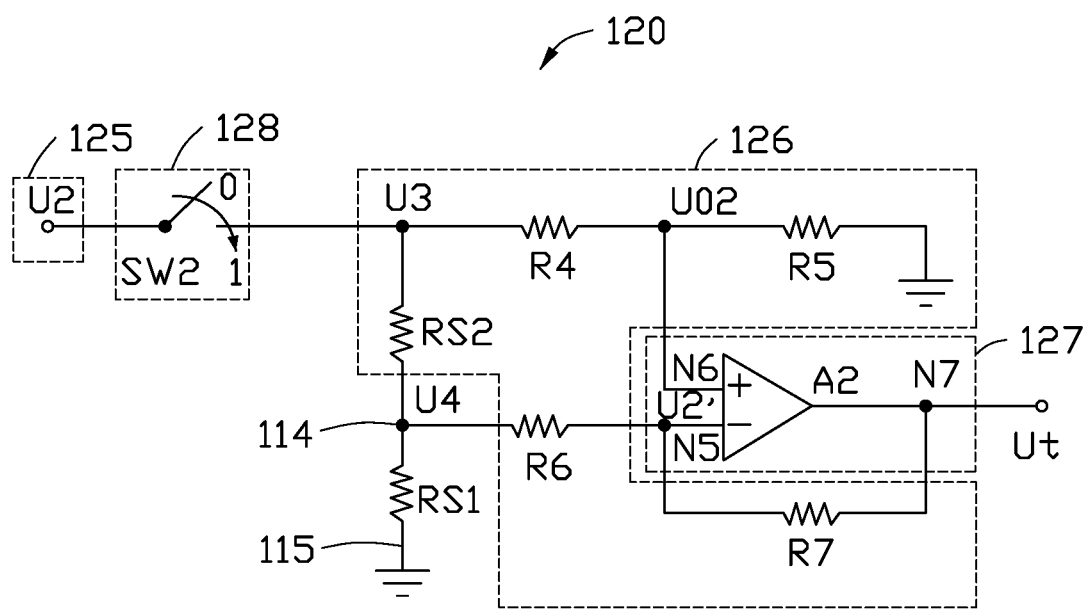
FIG. 9 is a diagram of an equivalent circuit of a detection device of the identification system in FIG. 9.

FIG. 9 shows a second embodiment of the resistance detection circuit 120.

The resistance detection circuit 120 in the second embodiment includes a second voltage source 125, a second detection module 126, and a second comparison module 127.

The second voltage source 125 is used to provide a second voltage U2. The second voltage source 125 is connected to the second detection module 126 to output the second voltage U2 to the second detection module 126.

The second detection module 126 receives the second voltage U2. The first connection pad 114 is electrically coupled to the second voltage source 125 and the second comparison module 127, and is further grounded through the second connection pad 115. The second sensing voltage UT is output to the second comparison module 127 according to the second voltage U2. The second detection module 126 includes a fourth resistor R4, a fifth resistor R5, a sixth resistor R6, a seventh resistor R7, and a second sense resistance Rs2. The fourth resistor R4 and the fifth resistor R5 are connected in series with each other, and are respectively coupled to the second voltage source 125 and to ground, and the resistance values thereof are equal. Therefore, when the value of the second voltage U2 is determined, the voltage of a node between the fourth resistor R4 and the fifth resistor R5 is determined, and the voltage of the node is defined as the second preset voltage U02. The first sense resistance Rs1 and the second sense resistance Rs2 are connected in series to each other and are respectively connected to the second voltage source 125 and to ground, and the first sense resistance Rs1 and the second sense resistance Rs2 are connected through the first connection pad 114.

The second comparison module 127 is connected to the second detection module 126 for comparing the second sensing voltage UT to the second preset voltage U02 and outputting the detection signal Ut according to the comparison result. The second comparison module 127 includes an operational amplifier A2. The operational amplifier A2 includes a third input terminal N5, a fourth input terminal N6, and a second detection signal output terminal N7. The third input terminal N5 is connected to the first connection pad 114 through the sixth resistor R6. The second sensing voltage U2' is received through the first connection pad 114, and the second detection signal output terminal N7 is connected through the seventh resistor R7. The fourth input terminal N6 is a non-inverting input terminal of the operational amplifier A2 and is connected to a node between the fourth resistor R4 and the fifth resistor R5 for inputting a second preset voltage U02. The second detection signal output terminal N7 outputs the detection signal Ut according to the comparison result between the second sensing voltage UT and the second preset voltage U02.

In one embodiment, the resistance detection circuit 120 further includes a second switch module 128. The second switch module 128 includes a second switch SW2. The second switch SW2 is connected between the second voltage source 125 and the second detection module 126 and is operable in either a state 1 or a state 0. State 1 indicates that the second switch SW2 is turned on, and state 0 indicates that the second switch SW2 is turned off. The second switch SW2 is switchable between state 1 and state 0 according to the second voltage U2. When the second voltage U2 is at a high voltage level, the second switch SW2 is in the state 1, and when the second voltage U2 is at a low voltage level, the second switch SW2 is in the state 0. The second switch SW2 in this embodiment can achieve all the beneficial effects of the first switch SW1 as described in the first embodiment.

Figure 10:
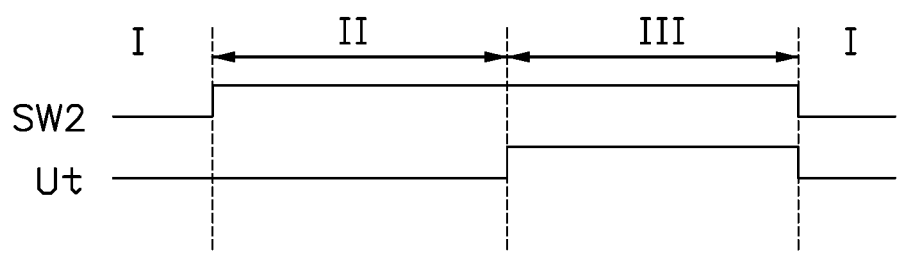
FIG. 10 is a comparison of a state of a second switch SW2 and an output state of a detection signal IA of a second detection signal output terminal N7.

As shown in FIG. 10, a comparison of a state of the second switch SW2 and an output state of the detection signal Ut of the second detection signal output terminal N7 is shown, which mainly includes three phases of phase I, phase II, and phase III. In the present embodiment, a first input voltage of a node between the second switch SW2 and the fourth resistor R4 is represented as U3, a second input voltage at a node between the first sense resistance Rs1 and the second sense resistance Rs2 is represented as U4.

In this embodiment, the second voltage U2 is a power supply voltage output by the second voltage source 125, which can be switched between a low level and a high level. In phase I, the second voltage source 125 outputs the second voltage U2. When the second switch SW2 is in the off state, the second detection signal output terminal N7 outputs the detection signal Ut as 0, and the resistance detection circuit 120 is not in the working state.

In phase II, the second voltage source 125 outputs the second voltage U2 at a high level, and the second switch SW2 is in the on state. The first input voltage U3 is greater than the second input voltage U4. Because the fourth resistor R4 and the sixth resistor R6 have a same resistance value, the second sensing voltage U2' is smaller than the second preset voltage U02. At this time, the voltage input by the third input terminal N5 of the operational amplifier A2 is smaller than the voltage value input by the fourth input terminal N6, and a second detection is performed. The detection signal Ut outputted by the signal output terminal N7 is 1, which represents that the refraction layer 113 is in the normal state.

In phase III, the refraction layer 113 is damaged, and the conductive layer 112 is also damaged. The resistance of the conductive layer 112 increases, and the resistance value of the first sense resistance Rs1 is much larger than the resistance value of the second sense resistance Rs2, so the second sensing voltage U2 is equal to the second preset voltage U02. At this time, the voltage value input by the third input terminal N5 of the operational amplifier A2 is greater than the voltage value input by the fourth input terminal N6, and the detection signal Ut is output as 0, which represents that the refraction layer 113 is in the abnormal state.

In the above embodiment, the detection signal Ut represents whether the resistance of the conductive layer 112 (the first sense resistance Rs1) is maintained at the initial resistance value, thereby determining the state (normal or abnormal) of the refraction layer 113.

In this embodiment, when the detection signal Ut is output as 0, the controller 130 determines that the light refraction layer 113 is in the abnormal state, and does not output the control signal Uc. When the detection signal Ut is output as 1, the controller 130 determines that the refraction layer 113 is in the normal state, and the output control signal Uc is output to control the light source 200 to emit light (refer to FIG. 8).

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A detection device comprising:
a light refraction structure comprising a substrate, a conductive layer, and a refraction layer, wherein the conductive layer and the refraction layer are formed on the substrate, and the conductive layer comprises a resistance; and
a resistance detection circuit electrically coupled to the conductive layer and adapted to detect the resistance of the conductive layer, wherein the resistance detection circuit generates a detection signal according to a change in the resistance, and the detection signal represents a state of the refraction layer;
the conductive layer comprises a light input surface and a light output surface;
the substrate is mounted on the light input surface;
the refraction layer is mounted on the light output surface;
the light refraction structure comprises a first connection pad and a second connection pad;
the conductive layer is coupled between the first connection pad and the second connection pad.

2. The detection device of claim 1 further comprising a controller coupled to a light source and the resistance detection circuit, wherein the controller is adapted to control the light source whether to emit light according to the detection signal.

3. The detection device of claim 1, wherein the resistance detection circuit comprises:
a first voltage source adapted to provide a first voltage;
a first detection module electrically coupled to the conductive layer through the first connection pad and the second connection pad and adapted to receive the first voltage and output a first sensing voltage according to the first voltage;
a first comparison module coupled to the first detection module and adapted to compare the first sensing voltage to a first preset voltage and output the detection signal according to a comparison result.

4. The detection device of claim 3, wherein:
the first detection module and a first sense resistance form an electric bridge, wherein the first sense resistance is an equivalent resistance of the conductive layer;
the first comparison module comprises a first input terminal, a second input terminal, and a first detection signal output terminal;
the first input terminal is adapted to receive the first sensing voltage;
the second input terminal is adapted to input the first preset voltage;
the first detection signal output terminal is adapted to output the detection signal according to the comparison result.

5. The detection device of claim 4, wherein:
when the first sensing voltage is equal to the first preset voltage, the refraction layer is in a normal state;
when the first sensing voltage is not equal to the first preset voltage, the refraction layer is in an abnormal state.

6. The detection device of claim 1, wherein the resistance detection circuit comprises:
a second voltage source adapted to provide a second voltage;
a second detection module electrically coupled to the second voltage source through the first connection pad and adapted to receive the second voltage and output a second sensing voltage according to the second voltage;
a second comparison module coupled to the second detection module through the first connection pad and adapted to compare the second sensing voltage to a second preset voltage and output the detection signal according to a comparison result.

7. The detection device of claim 6, wherein:
the second comparison module comprises a third input terminal, a fourth input terminal, and a second detection signal output terminal;
the third input terminal is adapted to input the second sensing voltage;
the fourth input terminal is adapted to input the second preset voltage;
the second detection signal output terminal is adapted to output the detection signal according to the comparison result.

8. The detection device of claim 7, wherein:
when the second sensing voltage is equal to the second preset voltage, the refraction layer is in an abnormal state; and
when the second sensing voltage is not equal to the second preset voltage, the refraction layer is in a normal state.

9. An identification system comprising:
a light source module comprising a light source; and
a detection device comprising:
a light refraction structure comprising a substrate, a conductive layer, and a refraction layer, wherein the conductive layer and the refraction layer are formed on the substrate, and the conductive layer comprises a resistance; and
a resistance detection circuit electrically coupled to the conductive layer and adapted to detect the resistance of the conductive layer, wherein the resistance detection circuit generates a detection signal according to a change in the resistance, and the detection signal represents a state of the refraction layer; wherein the refraction structure is mounted in a light path of the light source;
the conductive layer comprises a light input surface and a light output surface;
the substrate is mounted on the light input surface;
the refraction layer is mounted on the light output surface;
the light refraction structure comprises a first connection pad and a second connection pad;
the conductive layer is coupled between the first connection pad and the second connection pad.

10. The identification system of claim 9 further comprising a controller coupled to the light source and the resistance detection circuit, wherein the controller is adapted to control the light source whether to emit light according to the detection signal.

11. The identification system of claim 9, wherein the resistance detection circuit comprises:
a first voltage source adapted to provide a first voltage;
a first detection module electrically coupled to the conductive layer through the first connection pad and the second connection pad and adapted to receive the first voltage and output a first sensing voltage according to the first voltage;
a first comparison module coupled to the first detection module and adapted to compare the first sensing voltage to a first preset voltage and output the detection signal according to a comparison result.

12. The identification system of claim 11, wherein:
the first detection module and a first sense resistance form an electric bridge, wherein the first sense resistance is an equivalent resistance of the conductive layer;
the first comparison module comprises a first input terminal, a second input terminal, and a first detection signal output terminal;
the first input terminal is adapted to receive the first sensing voltage;
the second input terminal is adapted to input the first preset voltage;
the first detection signal output terminal is adapted to output the detection signal according to the comparison result.

13. The identification system of claim 12, wherein:
when the first sensing voltage is equal to the first preset voltage, the refraction layer is in a normal state;
when the first sensing voltage is not equal to the first preset voltage, the refraction layer is in an abnormal state.

14. The identification system of claim 9, wherein the resistance detection circuit comprises:
a second voltage source adapted to provide a second voltage;
a second detection module electrically coupled to the second voltage source through the first connection pad and adapted to receive the second voltage and output a second sensing voltage according to the second voltage;
a second comparison module coupled to the second detection module through the first connection pad and adapted to compare the second sensing voltage to a second preset voltage and output the detection signal according to a comparison result.

15. The identification system of claim 14, wherein:
the second comparison module comprises a third input terminal, a fourth input terminal, and a second detection signal output terminal;
the third input terminal is adapted to input the second sensing voltage;
the fourth input terminal is adapted to input the second preset voltage;
the second detection signal output terminal is adapted to output the detection signal according to the comparison result.

16. The identification system of claim 15, wherein:
when the second sensing voltage is equal to the second preset voltage, the refraction layer is in an abnormal state; and
when the second sensing voltage is not equal to the second preset voltage, the refraction layer is in a normal state.

* * * * *